United States Patent
Xu

(10) Patent No.: US 10,957,270 B1
(45) Date of Patent: Mar. 23, 2021

(54) GOA CIRCUIT AND LIQUID CRYSTAL DISPLAY DEVICE HAVING THE SAME

(71) Applicant: SHENZHEN CHINA STAR OPTOELECTRONICS TECHNOLOGY CO., LTD., Guangdong (CN)

(72) Inventor: Xiangyang Xu, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 365 days.

(21) Appl. No.: 16/096,006

(22) PCT Filed: Aug. 31, 2018

(86) PCT No.: PCT/CN2018/103475
§ 371 (c)(1),
(2) Date: Oct. 24, 2018

(87) PCT Pub. No.: WO2020/019407
PCT Pub. Date: Jan. 30, 2020

(30) Foreign Application Priority Data

Jul. 23, 2018 (CN) .......................... 201810811705.X

(51) Int. Cl.
*G09G 3/36* (2006.01)
(52) U.S. Cl.
CPC ... *G09G 3/3677* (2013.01); *G09G 2300/0408* (2013.01); *G09G 2310/06* (2013.01); *G09G 2310/08* (2013.01)
(58) Field of Classification Search
CPC ......... G09G 3/3677; G09G 2310/0286; G09G 2300/0408; G09G 3/3648;

(Continued)

(56) References Cited

U.S. PATENT DOCUMENTS

| 6,919,874 B1 | 7/2005 | Maurice |
| 9,595,234 B2 * | 3/2017 | Dai .......................... G09G 3/36 |

(Continued)

FOREIGN PATENT DOCUMENTS

| CN | 105390115 A | 3/2016 |
| CN | 106710550 A | 5/2017 |

(Continued)

OTHER PUBLICATIONS

Office Action dated Jul. 1, 2019 from corresponding application No. CN 201810811705.X.

(Continued)

*Primary Examiner* — Duc Q Dinh
(74) *Attorney, Agent, or Firm* — Leong C. Lei

(57) ABSTRACT

A GOA circuit is disclosed. The circuit includes multiple cascaded GOA units, wherein the nth stage GOA unit charges the nth horizontal scanning line, and the nth stage GOA unit includes: a pull-up control circuit, a pull-up circuit, a voltage stabilization circuit, a pull-down circuit, a first pull-down maintaining circuit and a second pull-down maintaining circuit; a pull-up control circuit for outputting a pull-up control signal Q(n); and a pull-up circuit for outputting an nth stage transmission signal ST(n) and the nth stage scan driving signal G(n); the voltage stabilization circuit for maintain the stability of the Q(n) at low voltage level; the pull-down circuit makes the Q(n) and G(n) to be at an off state; the pull-down maintaining circuit and the second pull-down maintaining circuit alternately operate to maintain Q(n) and G(n) at the off state. A liquid crystal display device having the above GOA circuit is also disclosed.

18 Claims, 3 Drawing Sheets

(58) Field of Classification Search
CPC ..... G09G 2310/0267; G09G 2330/021; G09G 3/3696; G09G 2300/0426; G09G 3/3266; G09G 3/3674; G09G 2310/0202
USPC .................................................. 345/98–100
See application file for complete search history.

(56) References Cited

U.S. PATENT DOCUMENTS

| | | | | |
|---|---|---|---|---|
| 2010/0309191 | A1* | 12/2010 | Hsu ........................ | G11C 19/28 345/213 |
| 2011/0150169 | A1 | 6/2011 | Lin | |
| 2014/0176410 | A1* | 6/2014 | Ma ........................ | H03K 3/012 345/92 |

FOREIGN PATENT DOCUMENTS

| | | |
|---|---|---|
| CN | 206322458 U | 7/2017 |
| CN | 107909980 A | 4/2018 |

OTHER PUBLICATIONS

International Search Report issued in corresponding International Application No. PCT/CN2018/103475, dated Apr. 25, 2019.

\* cited by examiner

GOA CIRCUIT AND LIQUID CRYSTAL DISPLAY DEVICE HAVING THE SAME

CROSS-REFERENCE TO RELATED APPLICATION

This application is a National Phase of International Application Number PCT/CN2018/103475, filed Aug. 31, 2018, and claims the priority of Chinese Patent Application No. 201810811705.X, entitled "GOA CIRCUIT AND LIQUID CRYSTAL DISPLAY DEVICE HAVING THE SAME", filed on Jul. 23, 2018, the disclosure of which is incorporated herein by reference in its entirety.

FIELD OF THE INVENTION

The present invention relates to a liquid crystal display technology field, and more particularly to a GOA (Gate driver On Array) circuit and a liquid crystal display device having the same.

BACKGROUND OF THE INVENTION

The liquid crystal display has the advantages of thin and light, energy-saving, and lower radiation index than that of a CRT (Cathode Ray Tube) display, so that it gradually replaces the CRT display and realizes wide application in various electronic products. At present, the driving of the horizontal scanning line of the active liquid crystal display panel is mainly completed by an IC (Integrated Circuit) which is externally connected to the panel, and the external IC can control the charging and discharging of the horizontal scanning lines of each stage. The GOA technology uses a TFT (Thin Film Transistor) liquid crystal display array process to fabricate a gate scan driving signal circuit on an array substrate, thereby implementing a driving way to gate electrodes row by row. Therefore, an original manufacturing process of the liquid crystal display panel can be used. In the original process, the driving circuit of the horizontal scanning line is fabricated on the substrate around the display region. GOA technology can reduce the bonding process of external ICs, increase productivity and reduce product cost, and make LCD panel to be more suitable for a narrow-frame or a frameless display product.

The main architecture of the GOA circuit includes a pull-up control circuit, a pull-up circuit, a pull-down circuit, and a pull-down maintaining circuit. Wherein, the pull-up circuit is configured to output a clock signal as a scan driving signal, the pull-up control circuit is configured to output a pull-up control signal to control a turn-on time of the pull-up circuit, and the pull-down circuit is configured to pull low the pull-up control signal and the scan driving signals, and the pull-down maintaining circuit is used to maintain the pull-up control signal and the scan driving signal at a low voltage level. Wherein, the more stable the low voltage level of the pull-up control signal is, the more stable the low voltage level of the scan driving signal is, so maintaining the stability of the low voltage level of the pull-up control signal has a great significance for improving the driving capability of the GOA circuit.

SUMMARY OF THE INVENTION

The embodiment of the invention provides a GOA circuit and a liquid crystal display device having the same, which can improve the driving capability of the GOA circuit and increase the charging rate of the liquid crystal display panel by adding a voltage stabilization circuit to the GOA circuit.

An embodiment of the present invention provides a GOA circuit, comprising: multiple cascaded GOA units, wherein a nth stage GOA unit charges a nth horizontal scanning line of a display region of a liquid crystal display panel, and the nth stage GOA unit includes at least a pull-up control circuit, a pull-up circuit, a voltage stabilization circuit, a pull-down circuit, a first pull-down maintaining circuit, and a second pull-down maintaining circuit, where n is a positive integer;

wherein the pull-up control circuit receives a start signal and outputs a pull-up control signal Q(n) according to the start signal;

wherein the pull-up circuit is electrically connected to the pull-up control circuit, and the pull-up circuit receives the pull-up control signal Q(n) and a first clock signal CK1, and outputs a nth stage transmission signal ST(n) and a nth stage scan driving signal G(n) according to the pull-up control signal Q(n) and the first clock signal;

wherein the voltage stabilization circuit is electrically connected to the pull-up control circuit and the pull-up circuit, and the voltage stabilization circuit receives the nth scan driving signal G(n) and a second clock CK2, and maintains the stability of a low voltage level of the pull-up control signal Q(n) according to the nth scan driving signal G(n) and the second clock signal CK2;

wherein the pull-down circuit is electrically connected to the pull-up control circuit, the pull-up circuit, and the voltage stabilization circuit, wherein the pull-down circuit receives a direct-current (DC) low-voltage signal Vss and according to the DC low-voltage signal Vss to pull down the pull-up control signal Q(n), and further pulls down the nth scan driving signal G(n) to cause the pull-up control signal Q(n) and the nth scan driving signal G(n) at an off state, and outputs an (n+1)th stage scan driving signal G(n+1) according to the DC low-voltage signal;

wherein the first pull-down maintaining circuit is electrically connected to the pull-up control circuit, the pull-up circuit, the voltage stabilization circuit, and the pull-down circuit, wherein the first pull-down maintaining circuit receives a first low-frequency signal LC1 and the DC low-voltage signal Vss, and maintains the pull-up control signal Q(n) and the nth stage scan driving signal G(n) at an off state according to the first low-frequency signal LC1 and the DC low-voltage signal;

wherein the second pull-down maintaining circuit is electrically connected to the pull-up control circuit, the pull-up circuit, the voltage stabilization circuit, the pull-down circuit, and the first pull-down maintaining circuit, wherein the second pull-down maintaining circuit receives a second low-frequency signal LC2 and the DC low-voltage signal Vss, and maintains the pull-up control signal Q(n) and the nth stage scan driving signal G(n) at an off state according to the second low-frequency signal LC2 and the DC low-voltage signal Vss.

Wherein when n=1, the start signal is an initial signal, and the pull-up control circuit outputs a pull-up control signal Q(n) according to the initial signal; when n>1, the start signal is a (n−1)th stage transmission signal ST(n−1) and a (n−1)th stage scan driving signal G(n−1) outputted by the (n−1)th stage GOA unit, the pull-up control circuit outputs a pull-up control signal Q(n) according to the (n−1)th stage transmission signal ST(n−1) and the (n−1)th stage scan driving signal G(n−1).

Wherein the first pull-down maintaining circuit and the second pull-down maintaining circuit alternately operate to maintain the pull-up control signal Q(n) and the nth scan driving signal G(n) to be remained at the off state; the first clock signal CK1 and the second clock signal CK2 are mutually inverted signal.

Wherein the pull-up control circuit includes: a first thin-film transistor; wherein when n=1, a control terminal and a first terminal of the first thin-film transistor T11 is inputted with an initial signal, and a second terminal of the first thin-film transistor T11 is connected to a pull-up control signal point Q for outputting a pull-up control signal Q(n) according to the initial signal; when n>1, the control terminal of the first thin-film transistor T11 inputs a (n−1)th stage transmission signal ST(n−1), and the first terminal of the first thin-film transistor T11 inputs the (n−1)th stage scan driving signal G(n−1) and the second terminal of the first thin-film transistor T11 is connected to the pull-up control signal point Q for outputting the pull-up control signal Q(n) according to the (n−1)th stage transmission signal ST(n−1) and the (n−1)th stage scan driving signal G(n−1).

Wherein the pull-up circuit includes a second thin-film transistor T22 and a third thin-film transistor T21, a control terminal of the second thin-film transistor T22 is electrically connected to the pull-up control signal point Q for receiving the pull-up control signal Q(n), and a first terminal of the second thin-film transistor T22 inputs a first clock signal CK1, a second terminal of the second thin-film transistor T22 outputs an nth stage transmission signal ST(n) according to the pull up control signal Q(n) and the first clock signal CK1; a control terminal of the third thin-film transistor T21 is electrically connected to the pull-up control signal point Q for receiving the pull-up control signal Q(n), a first terminal of the third thin-film transistor T21 inputs the first clock signal CK1, and a second terminal of the third thin-film transistor T21 is electrically connected to a horizontal scanning line G for outputting an nth stage scan driving signal G(n) according to the pull-up control signal Q(n) and the first clock signal; the voltage stabilization circuit includes a first capacitor C1, a second capacitor C2; one end of the first capacitor is electrically connected to the pull-up control signal point Q for receiving the pull-up control signal Q(n), and the other end of the first capacitor inputs a second clock signal CK2; one end of the second capacitor is electrically connected to the pull-up control signal point Q for receiving the pull-up control signal Q(n), and the other end of the second capacitor is electrically connected to the horizontal scanning line G; the pull-down circuit includes a fifth thin-film transistor T41 and a sixth thin-film transistor T31; a first terminal of the fifth thin-film transistor T41 is inputted with the DC low-voltage signal Vss, and a second terminal of the fifth thin-film transistor T41 is electrically connected to the pull-up control signal point Q for pulling down the pull-up control signal Q(n) according to the DC low-voltage signal Vss such that the pull-up control signal Q(n) is at an off state, and a control terminal of the fifth thin-film transistor T41 is electrically connected to a control terminal of the sixth thin-film transistor T31 for outputting a (n+1)th scan driving signal G(n+1) according to the DC low voltage signal Vss; a first terminal of the sixth thin-film transistor T31 inputs the DC low voltage signal Vss, and a second terminal of the sixth thin-film transistor T31 is electrically connected to the horizontal scanning line G to pull down the nth stage scan driving signal G(n) according to the DC low voltage signal Vss, so that the nth stage scan driving signal G(n) is at an off state.

Wherein the first pull-down maintaining circuit specifically includes: a seventh thin-film transistor T51, an eighth thin-film transistor T52, a ninth thin-film transistor T53, a tenth thin-film transistor T54, an eleventh thin-film transistor T42, and a twelve thin-film transistor T32; a control terminal and a first terminal of the seventh thin-film transistor T51 are inputted with a first low frequency signal LC1, and a second terminal of the seventh thin-film transistor T51 is electrically connected to a first terminal of the eighth thin-film transistor T52 and a control terminal of the ninth thin-film transistor T53; a control terminal of the eighth thin-film transistor T52 is electrically connected to the pull-up control signal point Q for inputting the pull-up control signal Q(n), and the second terminal of the eighth thin-film transistor T52 is inputted with the DC low voltage signal Vss; a first terminal of the ninth thin-film transistor T53 is inputted with the first low frequency signal LC1, and a second terminal of the ninth thin-film transistor T53 is electrically connected to a first terminal of the tenth thin-film transistor T54, a control terminal of an eleventh thin-film transistor T42 and a control terminal of the twelfth thin-film transistor T32 through the first signal point S; a control terminal of the tenth thin-film transistor T54 is electrically connected to the pull-up control signal point Q for inputting the pull-up control signal Q(n), and a second terminal of the tenth thin-film transistor T54 is inputted with the DC low-voltage signal Vss; a first terminal of the eleventh thin-film transistor T42 is inputted with the DC low voltage signal Vss, and the second terminal of the eleventh thin-film transistor T42 is electrically connected to the pull-up control signal point Q for maintaining the pull-up control signal Q(n) at an off state according to the first low frequency signal LC1 and the DC low voltage signal Vss; a first terminal of the twelfth thin-film transistor T32 is inputted with the DC low voltage signal Vss, and a second terminal of the twelfth thin-film transistor T32 is electrically connected to the horizontal scanning line G for maintaining the nth-stage scan driving signal G(n) at an off state according to the first low frequency signal LC1 and the DC low voltage signal Vss; the second pull-down maintaining circuit includes: a thirteenth thin-film transistor T61, a fourteenth thin-film transistor T62, a fifteenth thin-film transistor T63, a sixteenth thin-film transistor T64, and a seventeenth thin-film transistor T43, and an eighteenth thin-film transistor T33; a control terminal and a first terminal of the thirteenth thin-film transistor T61 are inputted with a second low frequency signal LC2, and a second terminal of the thirteenth thin-film transistor T61 is electrically connected to a first terminal of the fourteenth thin-film transistor T62 and a control terminal of the fifteenth thin-film transistor T63; a control terminal of the fourteenth thin-film transistor T62 is electrically connected to the pull-up control signal point Q for inputting the pull-up control signal Q(n), and a second terminal of the fourteenth thin-film transistor T62 is inputted with the DC low-voltage signal Vss; a first terminal of the fifteenth thin-film transistor T63 is inputted with the second low-frequency signal LC2, and a second terminal of the fifteenth thin-film transistor T63 is electrically connected to a first terminal of the sixteenth thin-film transistor T64, a control terminal of the seventeenth thin-film transistor T43, and a control terminal of the eighteenth thin-film transistor T33; a control terminal of the sixteenth thin-film transistor T64 is electrically connected to the pull-up control signal point Q for inputting the pull-up control signal Q(n), and a second terminal of the sixteenth thin-film transistor T64 is inputted with the DC low-voltage signal Vss; a first terminal of the seventeenth thin-film transistor T43 is inputted with the DC low voltage signal Vss, and a second end terminal of the seventeenth thin-film transistor T43 is electrically connected to the pull-up control signal point Q for maintaining the pull-up control signal Q(n) at an off state according to the second low frequency signal LC2 and the DC low voltage signal Vss; the first terminal of the eighteenth thin-film transistor T33 is inputted with the DC low voltage signal Vss, and the second terminal of the eighteenth thin-film transistor T33 is electrically connected to the horizontal scanning line G for maintaining the nth scan driving signal G(n) at an off state according to the second low frequency signal LC2 and the DC low voltage signal Vss.

Wherein the pull-up control signal point Q is electrically connected to the horizontal scanning line G through a third capacitor Cb, and the third capacitor Cb is a bootstrap capacitor.

Wherein a signal period of the first low frequency signal LC1 and the second low frequency signal LC2 is 200 times of a frame period, a duty ratio is 1/2, and a phase difference between the low frequency signal LC1 and the second low frequency signal LC2 is 1/2 signal period.

Wherein the voltage level of operating point of the first pull-down maintaining circuit and the second pull-down maintaining circuit are a low voltage level of the pull-up control signal Q(n) and a high voltage level of the first low frequency signal LC1, and the ow voltage level of the pull-up control signal Q(n) and a high voltage level of the second low frequency signal LC2.

Correspondingly, another embodiment of the present invention also provides a liquid crystal display device including the above GOA circuit.

In summary, the embodiment of the present invention provides a GOA circuit and a liquid crystal display device having the GOA circuit. The GOA circuit comprises multiple cascaded GOA units, wherein a nth stage GOA unit charges a nth horizontal scanning line of a display region of a liquid crystal display panel, and the nth stage GOA unit includes at least a pull-up control circuit, a pull-up circuit, a voltage stabilization circuit, a pull-down circuit, a first pull-down maintaining circuit, and a second pull-down maintaining circuit. The voltage stabilization circuit is electrically connected to the pull-up control circuit and the pull-up circuit, and can maintain the stability of the pull-up control signal at a low voltage level. That is, the present invention maintains the stability of the low voltage level of the pull-up control signal by adding a voltage stabilization circuit to the GOA circuit, thereby improving the stability of the output waveform of the scan driving signal, thereby improving the driving capability of the GOA circuit, improving the charging rate of the liquid crystal display panel.

BRIEF DESCRIPTION OF THE DRAWINGS

In order to more clearly illustrate the embodiments of the present invention or the technical solutions in the prior art, the drawings used in the embodiments or the prior art description will be briefly introduced below. Obviously, the drawings in the following description are only some embodiments of the present invention. For those of ordinary skill in the art, without creative labor, other drawings can also be obtained from these figures.

DETAILED DESCRIPTION OF PREFERRED EMBODIMENTS

Figure 1:
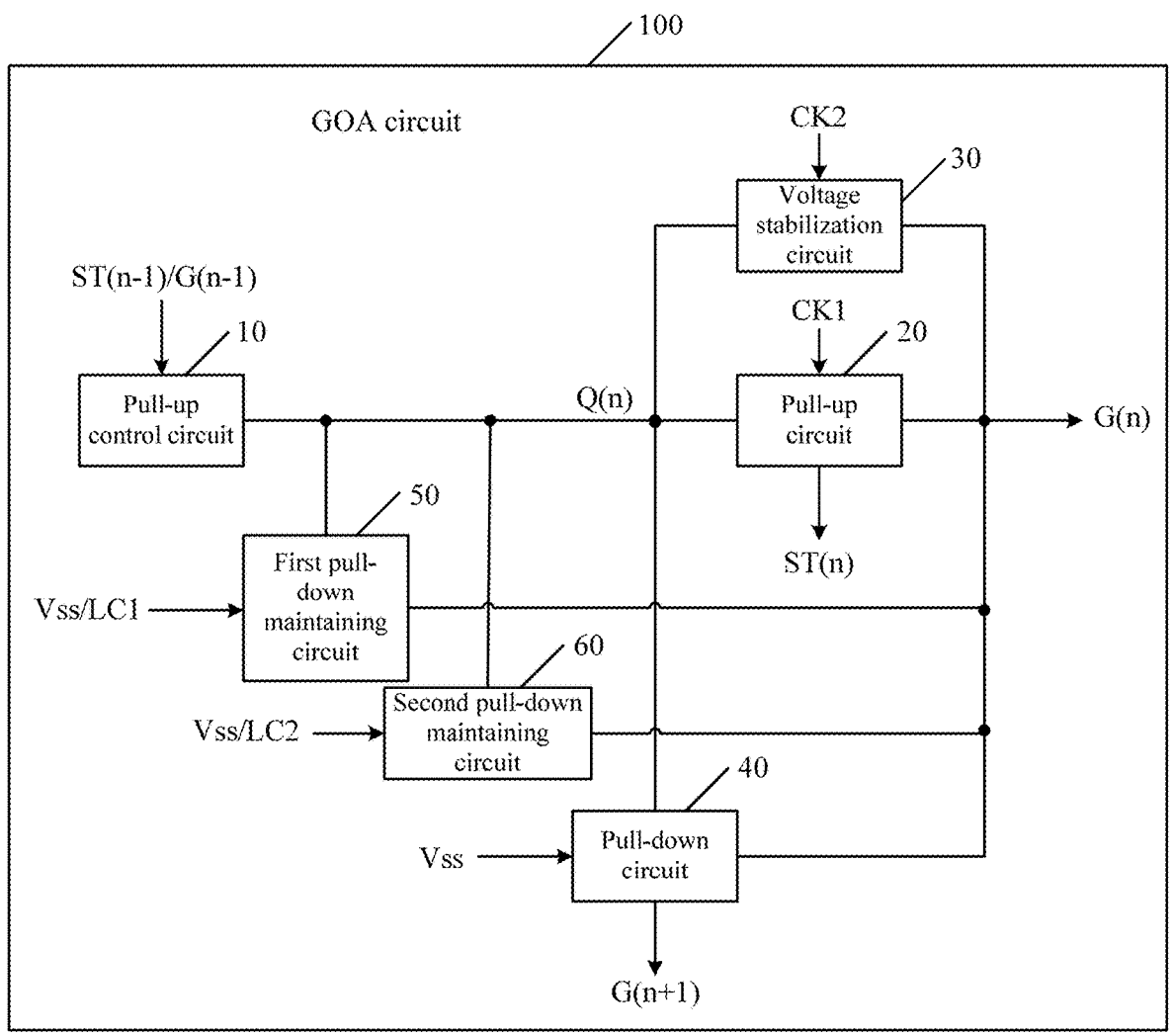
FIG. 1 is a schematic block diagram of a GOA circuit according to an embodiment of the present invention.

The technical solutions in the embodiments of the present invention are clearly and completely described in the following with reference to the accompanying drawings in the embodiments of the present invention. Obviously, the described embodiments are only a part of the embodiments of the present invention, and not all of the embodiments. All other embodiments obtained by those skilled in the art based on the embodiments of the present invention without creative efforts are within the scope of the present invention.

Besides, the description of the following embodiments is referred to the additional figures in order to exemplarily illustrate the specific embodiments of the present invention. The directional terms mentioned in the present invention such as "up", "down", "front", "rear", "left", "right", "inside", "outside", "side surface" and so on only refer to the direction of additional figures. Therefore, the adopted directional terms are for describing and understanding the present invention better and more clearly, not for indicating or implying the device or component having specific direction or operating by using a specific directional structure. Therefore, cannot be understood as the limitation of the present invention.

In the description of the present invention, it should be noted that unless additional definite rule and limitation are provided, the term "install", "link", "connect" should be understood broadly. For example, can be fixedly connected or detachably connected or integrally connected; or mechanically connected, directly connected, indirectly connected through an intermediate or internal communication between two components. For the person of ordinary skill in the art, the specific meaning of the present invention of the above terms can be understood based on specific situation.

Besides, in the description of the present invention, unless additional illustration, "multiple" means two or two above. If a term "process" is appeared in the description of the present invention, the term "process" does not only indicate an independent process, when the process cannot be distinguished from other processes, the expected functions that can be achieved by the process should also be included in that term. Besides, in the description of the present invention, a numerical range adopting "~" means that a value before "~" and a value after "~" are respectively a minimum value and maximum value, and including the minimum value and the maximum value. In the figures, a same numeral in the entire specification and figures represents a same or similar structure.

The embodiment of the invention provides a GOA (Gate Driver On Array) circuit, which can maintain the stability of the pull-up control signal at a low voltage level without affecting the high voltage level of the pull-up control signal. Therefore, the stability of the output waveform of the scan driving signal can be improved, thereby improving the driving capability of the GOA circuit. A GOA circuit and a liquid crystal display device having the same according to an embodiment of the present invention will be specifically described below with reference to FIG. 1 to FIG. 4.

Referring to FIG. 1, FIG. 1 is a schematic block diagram of a GOA circuit according to an embodiment of the present invention. The GOA circuit 100 shown in FIG. 1 includes multiple cascaded GOA units, wherein a nth stage GOA unit charges a nth horizontal scanning line of a display region of a liquid crystal display panel, and the nth stage GOA unit includes at least a pull-up control circuit 10, a pull-up circuit 20, a voltage stabilization circuit 30, a pull-down circuit 40, a first pull-down maintaining circuit 50, and a second pull-down maintaining circuit 60, where n is a positive integer.

Wherein, the pull-up control circuit 10 receives a start signal (not shown) and outputs a pull-up control signal Q(n) according to the start signal.

Specifically, when n=1, that is, when n is equal to 1, the start signal is an initial signal, and the pull-up control circuit 10 outputs a pull-up control signal Q(n) according to the initial signal; when n>1, that is, when n is greater than 1, the start signal is a (n−1)th stage transmission signal ST(n−1) and a (n−1)th stage scan driving signal G(n−1) outputted by the (n−1)th stage GOA unit. The pull-up control circuit 10 outputs a pull-up control signal Q(n) according to the (n−1)th stage transmission signal ST(n−1) and the (n−1)th stage scan driving signal G(n−1).

It can be seen that when n=1, the initial signal is responsible for starting the first stage GOA unit, and when n>1, the nth stage GOA unit is started by the (n−1)th stage transmission signal ST(n−1) and the (n−1)th stage scan driving signal G(n−1) outputted by the (n−1)th GOA unit. Thereby, the GOA circuit 100 is turned on stage by stage, and the line scan driving is realized, so that the horizontal scanning line can be charged stage by stage.

It should be noted that only the signal receiving condition of the pull-up control circuit 10 when n>1 is shown in FIG. 1

The pull-up circuit 20 is electrically connected to the pull-up control circuit 10, and the pull-up circuit 20 receives the pull-up control signal Q(n) and a first clock signal CK1, and outputs a nth stage transmission signal ST(n) and a nth stage scan driving signal G(n) according to the pull-up control signal Q(n) and the first clock signal CK1.

The voltage stabilization circuit 30 is electrically connected to the pull-up control circuit 10 and the pull-up circuit 20, and the voltage stabilization circuit 30 receives the nth scan driving signal G(n) and a second clock CK2, and maintains the stability of a low voltage level of the pull-up control signal Q(n) according to the nth scan driving signal G(n) and the second clock signal CK2.

It should be noted that, in the embodiment of the present invention, the first clock signal CK1 and the second clock signal CK2 are mutually inverted signals, that is, when the first clock signal CK1 is at a high voltage level state. The second clock signal CK2 is in a low voltage level state; and when the first clock signal CK1 is at a low voltage level state, the second clock signal CK2 is at a high voltage level state.

The pull-down circuit 40 is electrically connected to the pull-up control circuit 10, the pull-up circuit 20, and the voltage stabilization circuit 30, wherein the pull-down circuit 40 receives a direct-current (DC) low-voltage signal Vss and according to the DC low-voltage signal Vss to pull down the pull-up control signal Q(n), and further pulls down the nth scan driving signal G(n) to cause the pull-up control signal Q(n) and the nth scan driving signal G(n) at an off state (i.e., a low voltage level), and outputs an (n+1)th stage scan driving signal G(n+1) according to the DC low-voltage signal Vss.

The first pull-down maintaining circuit 50 is electrically connected to the pull-up control circuit 10, the pull-up circuit 20, the voltage stabilization circuit 30, and the pull-down circuit 40, wherein the first pull-down maintaining circuit 50 receives a first low-frequency signal LC1 and the DC low-voltage signal Vss, and maintains the pull-up control signal Q(n) and the nth stage scan driving signal G(n) at an off state according to the first low-frequency signal LC1 and the DC low-voltage signal Vss.

The second pull-down maintaining circuit 60 is electrically connected to the pull-up control circuit 10, the pull-up circuit 20, the voltage stabilization circuit 30, the pull-down circuit 40, and the first pull-down maintaining circuit 50. The second pull-down maintaining circuit 60 receives a second low-frequency signal LC2 and the DC low-voltage signal Vss, and maintains the pull-up control signal Q(n) and the nth stage scan driving signal G(n) at an off state according to the second low-frequency signal LC2 and the DC low-voltage signal Vss.

In an embodiment of the present invention, the first pull-down maintaining circuit 50 and the second pull-down maintaining circuit 60 alternately operate to maintain the pull-up control signal Q(n) and the nth scan driving signal G(n) to be remained at the off state (i.e., remain in the low voltage level state).

In the GOA circuit 100 provided by the embodiment of the present invention, by increasing the voltage stabilization circuit 30 in the GOA circuit 100 to maintain the stability of the low voltage of the pull-up control signal Q(n), the stability of the output waveform of the nth scan driving signal G(n) can be improved. Thereby, improving the driving ability of the GOA circuit 100, increasing the charging rate of the liquid crystal display panel.

Figure 2:
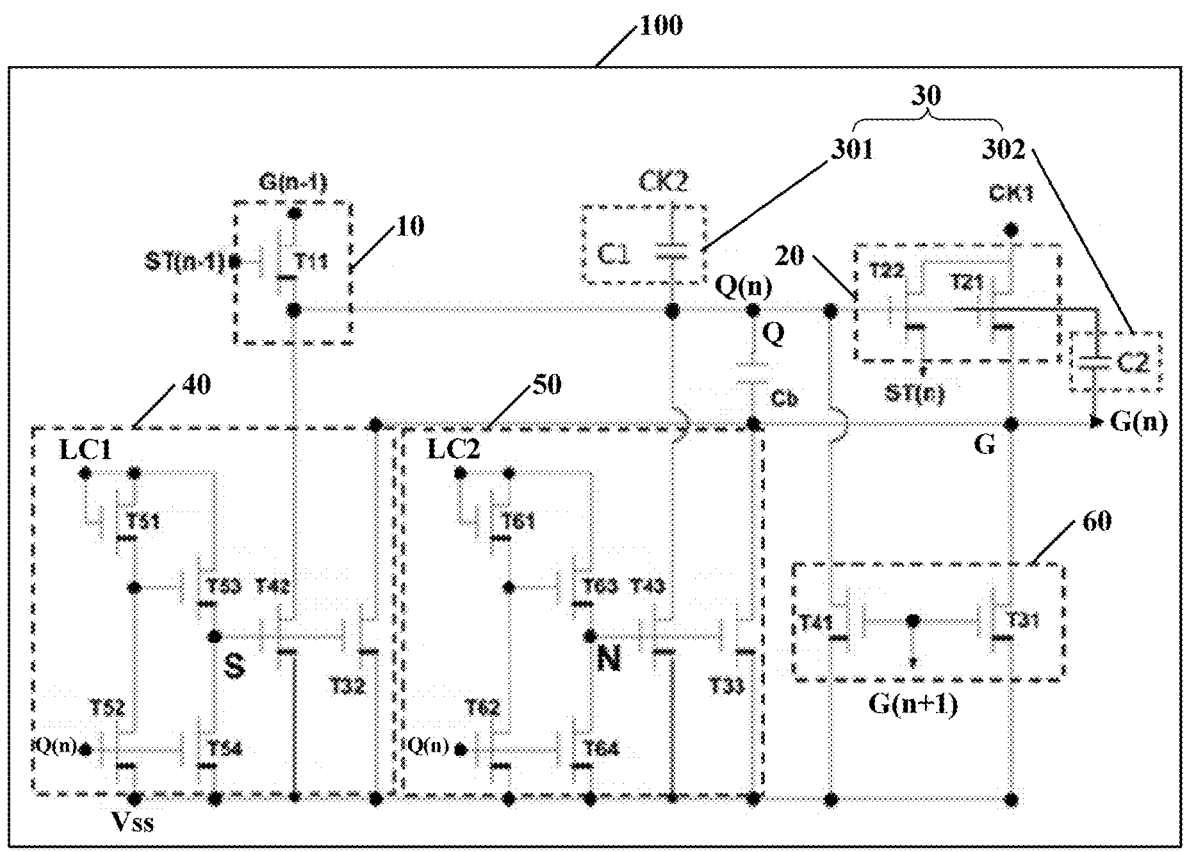
FIG. 2 is a schematic diagram of a circuit structure of the GOA circuit shown in FIG. 1.

Please refer to FIG. 1 and FIG. 2 together. FIG. 2 is a schematic diagram of a circuit structure of the GOA circuit shown in FIG. 1. The GOA circuit 100 shown in FIG. 2 includes a pull-up control circuit 10, a pull-up circuit 20, a voltage stabilization circuit 30, a pull-down circuit 40, a first pull-down maintaining circuit 50, and a second pull-down maintaining circuit 60.

The pull-up control circuit 10 specifically includes: a first thin-film transistor T11;

When n=1, that is, when n is equal to 1, a control terminal and a first terminal of the first thin-film transistor T11 is inputted with an initial signal, and a second terminal of the first thin-film transistor T11 is connected to a pull-up control signal point Q for outputting a pull-up control signal Q(n) according to the initial signal;

When n>1, that is, when n is greater than 1, the control terminal of the first thin-film transistor T11 inputs a (n−1)th stage transmission signal ST(n−1), and the first terminal of the first thin-film transistor T11 inputs the (n−1)th stage scan driving signal G(n−1) and the second terminal of the first thin-film transistor T11 is connected to the pull-up control signal point Q for outputting the pull-up control signal Q(n) according to the (n−1)th stage transmission signal ST(n−1) and the (n−1)th stage scan driving signal G(n−1).

It should be noted that only the signal input condition of the pull-up control circuit 10 when n>1 is shown in FIG. 2.

The pull-up circuit 20 specifically includes a second thin-film transistor T22 and a third thin-film transistor T21. A control terminal of the second thin-film transistor T22 is electrically connected to the pull-up control signal point Q for receiving the pull-up control signal Q(n), and a first terminal of the second thin-film transistor T22 inputs a first clock signal CK1, a second terminal of the second thin-film transistor T22 outputs an nth stage transmission signal ST(n) according to the pull up control signal Q(n) and the first clock signal CK1. A control terminal of the third thin-film transistor T21 is electrically connected to the pull-up control signal point Q for receiving the pull-up control signal Q(n), a first terminal of the third thin-film transistor T21 inputs the first clock signal CK1, and a second terminal of the third thin-film transistor T21 is electrically connected to a horizontal scanning line G for outputting an nth stage scan driving signal G(n) according to the pull-up control signal Q(n) and the first clock signal CK1.

The voltage stabilization circuit 30 includes a first voltage stabilization module 301 and a second voltage stabilization module 302.

Wherein, the first voltage stabilization module 301 specifically includes: a first capacitor (C1), one end of the first capacitor is electrically connected to the pull-up control signal point Q for receiving the pull-up control signal Q(n), and the other end of the first capacitor inputs a second clock signal CK2.

The second voltage stabilization module 302 specifically includes: a second capacitor (C2), one end of the second capacitor is electrically connected to the pull-up control signal point Q for receiving the pull-up control signal Q(n), and the other end of the second capacitor is electrically connected to the horizontal scanning line G.

The pull-down circuit 40 specifically includes a fifth thin-film transistor T41 and a sixth thin-film transistor T31. A first terminal of the fifth thin-film transistor T41 is inputted with the DC low-voltage signal Vss, and a second terminal of the fifth thin-film transistor T41 is electrically connected to the pull-up control signal point Q for pulling down the pull-up control signal Q(n) according to the DC low-voltage signal Vss such that the pull-up control signal Q(n) is at an off state (i.e., a low voltage level), and a control terminal of the fifth thin-film transistor T41 is electrically connected to a control terminal of the sixth thin-film transistor T31 for outputting a (n+1)th scan driving signal G(n+1) according to the DC low voltage signal Vss; a first terminal of the sixth thin-film transistor T31 inputs the DC low voltage signal Vss, and a second terminal of the sixth thin-film transistor T31 is electrically connected to the horizontal scanning line G to pull down the nth stage scan driving signal G(n) according to the DC low voltage signal Vss, so that the nth stage scan driving signal G(n) is at an off state (i.e., low voltage level).

The first pull-down maintaining circuit 50 specifically includes: a seventh thin-film transistor T51, an eighth thin-film transistor T52, a ninth thin-film transistor T53, a tenth thin-film transistor T54, an eleventh thin-film transistor T42, and a twelve thin-film transistor T32; a control terminal and a first terminal of the seventh thin-film transistor T51 are inputted with a first low frequency signal LC1, and a second terminal of the seventh thin-film transistor T51 is electrically connected to a first terminal of the eighth thin-film transistor T52 and a control terminal of the ninth thin-film transistor T53; a control terminal of the eighth thin-film transistor T52 is electrically connected to the pull-up control signal point Q for inputting the pull-up control signal Q(n), and the second terminal of the eighth thin-film transistor T52 is inputted with the DC low voltage signal Vss.

A first terminal of the ninth thin-film transistor T53 is inputted with the first low frequency signal LC1, and a second terminal of the ninth thin-film transistor T53 is electrically connected to a first terminal of the tenth thin-film transistor T54, a control terminal of an eleventh thin-film transistor T42 and a control terminal of the twelfth thin-film transistor T32 through the first signal point S; a control terminal of the tenth thin-film transistor T54 is electrically connected to the pull-up control signal point Q for inputting the pull-up control signal Q(n), and a second terminal of the tenth thin-film transistor T54 is inputted with the DC low-voltage signal Vss; a first terminal of the eleventh thin-film transistor T42 is inputted with the DC low voltage signal Vss, and the second terminal of the eleventh thin-film transistor T42 is electrically connected to the pull-up control signal point Q for maintaining the pull-up control signal Q(n) at an off state according to the first low frequency signal LC1 and the DC low voltage signal Vss; a first terminal of the twelfth thin-film transistor T32 is inputted with the DC low voltage signal Vss, and a second terminal of the twelfth thin-film transistor T32 is electrically connected to the horizontal scanning line G for maintaining the nth-stage scan driving signal G(n) at an off state according to the first low frequency signal LC1 and the DC low voltage signal Vss.

The second pull-down maintaining circuit 60 specifically includes: a thirteenth thin-film transistor T61, a fourteenth thin-film transistor T62, a fifteenth thin-film transistor T63, a sixteenth thin-film transistor T64, and a seventeenth thin-film transistor T43, and an eighteenth thin-film transistor T33; a control terminal and a first terminal of the thirteenth thin-film transistor T61 are inputted with a second low frequency signal LC2, and a second terminal of the thirteenth thin-film transistor T61 is electrically connected to a first terminal of the fourteenth thin-film transistor T62 and a control terminal of the fifteenth thin-film transistor T63; a control terminal of the fourteenth thin-film transistor T62 is electrically connected to the pull-up control signal point Q for inputting the pull-up control signal Q(n), and a second terminal of the fourteenth thin-film transistor T62 is inputted with the DC low-voltage signal Vss; a first terminal of the fifteenth thin-film transistor T63 is inputted with the second low-frequency signal LC2, and a second terminal of the fifteenth thin-film transistor T63 is electrically connected to a first terminal of the sixteenth thin-film transistor T64, a control terminal of the seventeenth thin-film transistor T43, and a control terminal of the eighteenth thin-film transistor T33 through the second signal point N.

A control terminal of the sixteenth thin-film transistor T64 is electrically connected to the pull-up control signal point Q for inputting the pull-up control signal Q(n), and a second terminal of the sixteenth thin-film transistor T64 is inputted with the DC low-voltage signal Vss; a first terminal of the seventeenth thin-film transistor T43 is inputted with the DC low voltage signal Vss, and a second end terminal of the seventeenth thin-film transistor T43 is electrically connected to the pull-up control signal point Q for maintaining the pull-up control signal Q(n) at an off state according to the second low frequency signal LC2 and the DC low voltage signal Vss; the first terminal of the eighteenth thin-film transistor T33 is inputted with the DC low voltage signal Vss, and the second terminal of the eighteenth thin-film transistor T33 is electrically connected to the horizontal scanning line G for maintaining the nth scan driving signal G(n) at an off state according to the second low frequency signal LC2 and the DC low voltage signal Vss.

It should be noted that, in the embodiment of the present invention, the pull-up control signal point Q is electrically connected to the horizontal scanning line G through a third capacitor (Cb). In an embodiment of the invention, the third capacitor (Cb) is a bootstrap capacitor.

It should be noted that, in an embodiment of the present invention, a signal period of the first low frequency signal LC1 and the second low frequency signal LC2 is 200 times of a frame period, a duty ratio is 1/2, and a phase difference between the low frequency signal LC1 and the second low frequency signal LC2 is 1/2 signal period.

It should be noted that, in an embodiment of the present invention, the voltage level of operating point of the first pull-down maintaining circuit 50 and the second pull-down maintaining circuit 60 are a low voltage level of the pull-up control signal Q(n) and a high voltage level of the first low frequency signal LC1 (or the second low frequency signal LC2).

Figure 3:
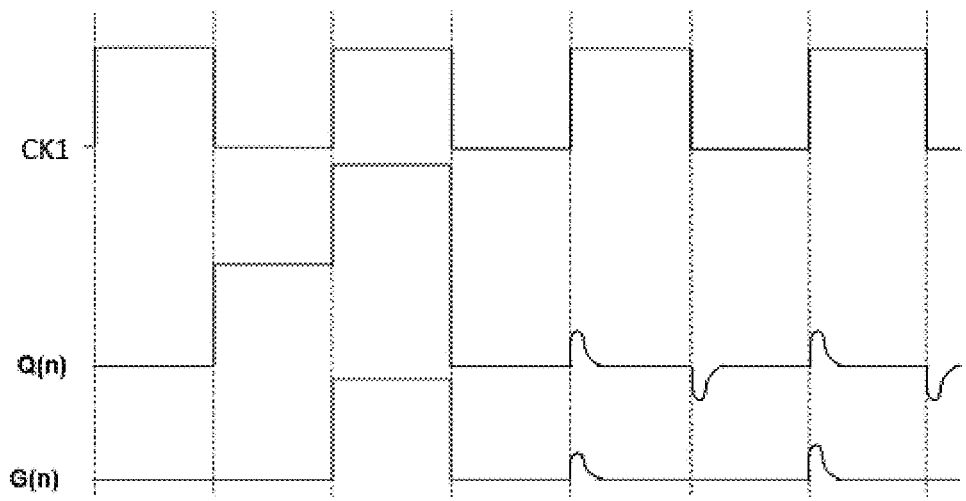
FIG. 3 is a waveform diagram of input and output signals in a GOA circuit of the prior art.

Please refer to FIG. 3. FIG. 3 is a schematic diagram of waveforms of input and output signals in a GOA circuit of the prior art. The first clock signal CK1, the pull-up control signal Q(n) and the nth scan driving signal G(n) are included. It should be noted that the prior art GOA circuit described in the present invention refers to a GOA circuit that does not include the voltage stabilization circuit 30. As can be seen from FIG. 3, in the prior art GOA circuit, when the pull-up control signal Q(n) is pulled low, due to the existence of parasitic capacitance in the third thin-film transistor T21, when the first clock signal CK1 outputs a high voltage level, the GOA circuit generates an interference signal that affects the pull-up control signal Q(n), thereby generating an interference signal that affects the pull-up control signal Q(n).

Figure 4:
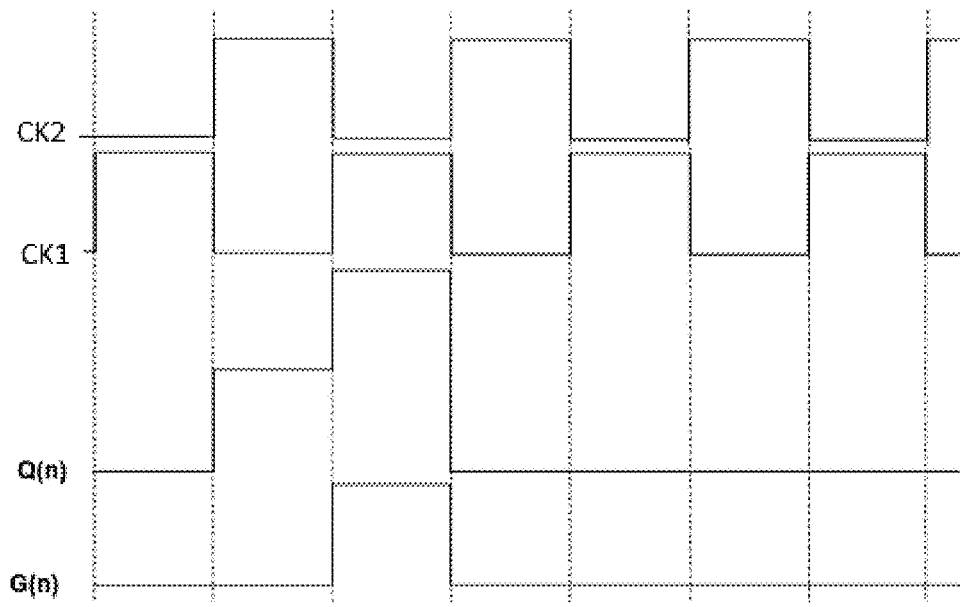
FIG. 4 is a waveform diagram of input and output signals in the GOA circuit shown in FIG. 1 and FIG. 2.

Please refer to FIG. 1 to FIG. 4 together. FIG. 4 is a schematic diagram of waveforms of input and output signals in the GOA circuit shown in FIG. 1 and FIG. 2. The first clock signal CK1, the second clock signal CK2, the pull-up control signal Q(n), and the n-th scan drive signal G(n) are included. As shown in FIG. 4, the first clock signal CK1 and the second clock signal CK2 are mutually inverted signals. In addition, as can be seen from FIG. 4, when the pull-up control signal Q(n) is pulled low, under the action of the voltage stabilization circuit 30, The GOA circuit 100 can maintain the stability of the pull-up control signal Q(n) at a low voltage level without affecting the high voltage level of the pull-up control signal Q(n). Thereby the stability of the output waveform of the nth stage scan driving signal G(n) can be improved, and improving the driving capability of the GOA circuit 100.

Accordingly, an embodiment of the present invention further provides a liquid crystal display device including the GOA circuit 100 shown in FIG. 1 and FIG. 2 described above. For example, the liquid crystal display device may include, but is not limited to, a mobile phone having a liquid crystal display panel (such as an Android mobile phone, an iOS mobile phone, etc.), a tablet computer, a MID (Mobile Internet Devices), a PDA (Personal Digital Assistant), laptops, televisions, electronic paper, digital photo frames, and more.

Compared with the poor stability of the pull-up control signal Q(n) at low voltage level in the prior art, the embodiment of the present invention maintains the pull-up control signal Q(n) by adding a voltage stabilization circuit 30 to the GOA circuit 100. The stability of the output waveform of the scan driving signal G(n) can be improved, thereby improving the driving ability of the GOA circuit 100, and increasing the charging rate of the liquid crystal display panel.

In the description of the present specification, the description with reference to the terms "one embodiment", "some embodiments", "example", "specific example" or "some examples" and the like means the specific features described in connection with the embodiments or examples, a structure, material or feature included in at least one embodiment or example of the invention. In the present specification, the schematic representation of the above terms does not necessarily refer to the same embodiment or example. Furthermore, the particular features, structures, materials, or characteristics described may be combined in a suitable manner in any one or more embodiments or examples.

The GOA circuit and the liquid crystal display device having the GOA circuit provided by the embodiment of the present invention are described in detail above. The principle and implementation of the present invention are described in the following by using specific examples. The above description of the embodiments is only for helping to understand the method of the present invention and its core ideas. At the same time, for those of ordinary skill in the art, according to the idea of the present invention, there are changes in the specific embodiments and application scopes. In summary, the content of the present specification should not be construed as limiting the present invention.

What is claimed is:

1. A GOA circuit, comprising:
multiple cascaded GOA units, wherein a nth stage GOA unit charges a nth horizontal scanning line of a display region of a liquid crystal display panel, and the nth stage GOA unit includes at least a pull-up control circuit, a pull-up circuit, a voltage stabilization circuit, a pull-down circuit, a first pull-down maintaining circuit, and a second pull-down maintaining circuit, where n is a positive integer;
wherein the pull-up control circuit receives a start signal and outputs a pull-up control signal Q(n) according to the start signal;
wherein the pull-up circuit is electrically connected to the pull-up control circuit, and the pull-up circuit receives the pull-up control signal Q(n) and a first clock signal CK1, and outputs a nth stage transmission signal ST(n) and a nth stage scan driving signal G(n) according to the pull-up control signal Q(n) and the first clock signal;
wherein the voltage stabilization circuit is electrically connected to the pull-up control circuit and the pull-up circuit, and the voltage stabilization circuit receives the nth scan driving signal G(n) and a second clock signal CK2, and maintains the stability of a low voltage level of the pull-up control signal Q(n) according to the nth scan driving signal G(n) and the second clock signal CK2;
wherein the pull-down circuit is electrically connected to the pull-up control circuit, the pull-up circuit, and the voltage stabilization circuit, wherein the pull-down circuit receives a direct-current (DC) low-voltage signal Vss and according to the DC low-voltage signal Vss to pull down the pull-up control signal Q(n), and further pulls down the nth scan driving signal G(n) to cause the pull-up control signal Q(n) and the nth scan driving signal G(n) at an off state, and outputs an (n+1)th stage scan driving signal G(n+1) according to the DC low-voltage signal;
wherein the first pull-down maintaining circuit is electrically connected to the pull-up control circuit, the pull-up circuit, the voltage stabilization circuit, and the pull-down circuit, wherein the first pull-down maintaining circuit receives a first low-frequency signal LC1 and the DC low-voltage signal Vss, and maintains the pull-up control signal Q(n) and the nth stage scan driving signal G(n) at an off state according to the first low-frequency signal LC1 and the DC low-voltage signal; and
wherein the second pull-down maintaining circuit is electrically connected to the pull-up control circuit, the pull-up circuit, the voltage stabilization circuit, the pull-down circuit, and the first pull-down maintaining circuit, wherein the second pull-down maintaining circuit receives a second low-frequency signal LC2 and the DC low-voltage signal Vss, and maintains the pull-up control signal Q(n) and the nth stage scan driving signal G(n) at an off state according to the second low-frequency signal LC2 and the DC low-voltage signal Vss.

2. The GOA circuit according to claim 1, wherein when n=1, the start signal is an initial signal, and the pull-up control circuit outputs a pull-up control signal Q(n) according to the initial signal; when n>1, the start signal is a (n−1)th stage transmission signal ST(n−1) and a (n−1)th stage scan driving signal G(n−1) outputted by the (n−1)th stage GOA unit, the pull-up control circuit outputs a pull-up control signal Q(n) according to the (n−1)th stage transmission signal ST(n−1) and the (n−1)th stage scan driving signal G(n−1).

3. The GOA circuit according to claim 1, wherein the first pull-down maintaining circuit and the second pull-down maintaining circuit alternately operate to maintain the pull-up control signal Q(n) and the nth scan driving signal G(n) to be remained at the off state; the first clock signal CK1 and the second clock signal CK2 are mutually inverted signal.

4. The GOA circuit according to claim 2, wherein the pull-up control circuit includes: a first thin-film transistor; wherein
when n=1, a control terminal and a first terminal of the first thin-film transistor T11 is inputted with an initial signal, and a second terminal of the first thin-film transistor T11 is connected to a pull-up control signal point Q for outputting a pull-up control signal Q(n) according to the initial signal;
when n>1, the control terminal of the first thin-film transistor T11 inputs a (n−1)th stage transmission signal ST(n−1), and the first terminal of the first thin-film transistor T11 inputs the (n−1)th stage scan driving signal G(n−1) and the second terminal of the first thin-film transistor T11 is connected to the pull-up control signal point Q for outputting the pull-up control signal Q(n) according to the (n−1)th stage transmission signal ST(n−1) and the (n−1)th stage scan driving signal G(n−1).

5. The GOA circuit according to claim 4, wherein
the pull-up circuit includes a second thin-film transistor T22 and a third thin-film transistor T21, a control terminal of the second thin-film transistor T22 is electrically connected to the pull-up control signal point Q for receiving the pull-up control signal Q(n), and a first terminal of the second thin-film transistor T22 inputs a first clock signal CK1, a second terminal of the second thin-film transistor T22 outputs an nth stage transmission signal ST(n) according to the pull up control signal Q(n) and the first clock signal CK1; a control terminal of the third thin-film transistor T21 is electrically connected to the pull-up control signal point Q for receiving the pull-up control signal Q(n), a first terminal of the third thin-film transistor T21 inputs the first clock signal CK1, and a second terminal of the third thin-film transistor T21 is electrically connected to a horizontal scanning line G for outputting an nth stage scan driving signal G(n) according to the pull-up control signal Q(n) and the first clock signal;
the voltage stabilization circuit includes a first capacitor C1, a second capacitor C2; one end of the first capacitor is electrically connected to the pull-up control signal point Q for receiving the pull-up control signal Q(n), and the other end of the first capacitor inputs a second clock signal CK2; one end of the second capacitor is electrically connected to the pull-up control signal point Q for receiving the pull-up control signal Q(n), and the other end of the second capacitor is electrically connected to the horizontal scanning line G; and
the pull-down circuit includes a fifth thin-film transistor T41 and a sixth thin-film transistor T31; a first terminal of the fifth thin-film transistor T41 is inputted with the DC low-voltage signal Vss, and a second terminal of the fifth thin-film transistor T41 is electrically connected to the pull-up control signal point Q for pulling down the pull-up control signal Q(n) according to the DC low-voltage signal Vss such that the pull-up control signal Q(n) is at an off state, and a control terminal of the fifth thin-film transistor T41 is electrically connected to a control terminal of the sixth thin-film transistor T31 for outputting a (n+1)th scan driving signal G(n+1) according to the DC low voltage signal Vss; a first terminal of the sixth thin-film transistor T31 inputs the DC low voltage signal Vss, and a second terminal of the sixth thin-film transistor T31 is electrically connected to the horizontal scanning line G to pull down the nth stage scan driving signal G(n) according to the DC low voltage signal Vss, so that the nth stage scan driving signal G(n) is at an off state.

6. The GOA circuit according to claim 5, wherein
the first pull-down maintaining circuit includes a seventh thin-film transistor T51, an eighth thin-film transistor T52, a ninth thin-film transistor T53, a tenth thin-film transistor T54, an eleventh thin-film transistor T42, and a twelve thin-film transistor T32; a control terminal and a first terminal of the seventh thin-film transistor T51 are inputted with a first low frequency signal LC1, and a second terminal of the seventh thin-film transistor T51 is electrically connected to a first terminal of the eighth thin-film transistor T52 and a control terminal of the ninth thin-film transistor T53; a control terminal of the eighth thin-film transistor T52 is electrically connected to the pull-up control signal point Q for inputting the pull-up control signal Q(n), and the second terminal of the eighth thin-film transistor T52 is inputted with the DC low voltage signal Vss;
a first terminal of the ninth thin-film transistor T53 is inputted with the first low frequency signal LC1, and a second terminal of the ninth thin-film transistor T53 is electrically connected to a first terminal of the tenth thin-film transistor T54, a control terminal of an eleventh thin-film transistor T42 and a control terminal of the twelfth thin-film transistor T32 through the first signal point S; a control terminal of the tenth thin-film transistor T54 is electrically connected to the pull-up control signal point Q for inputting the pull-up control signal Q(n), and a second terminal of the tenth thin-film transistor T54 is inputted with the DC low-voltage signal Vss; a first terminal of the eleventh thin-film transistor T42 is inputted with the DC low voltage signal Vss, and the second terminal of the eleventh thin-film transistor T42 is electrically connected to the pull-up control signal point Q for maintaining the pull-up control signal Q(n) at an off state according to the first low frequency signal LC1 and the DC low voltage signal Vss; a first terminal of the twelfth thin-film transistor T32 is inputted with the DC low voltage signal Vss, and a second terminal of the twelfth thin-film transistor T32 is electrically connected to the horizontal scanning line G for maintaining the nth-stage scan driving signal G(n) at an off state according to the first low frequency signal LC1 and the DC low voltage signal Vss;

the second pull-down maintaining circuit includes: a thirteenth thin-film transistor T61, a fourteenth thin-film transistor T62, a fifteenth thin-film transistor T63, a sixteenth thin-film transistor T64, and a seventeenth thin-film transistor T43, and an eighteenth thin-film transistor T33; a control terminal and a first terminal of the thirteenth thin-film transistor T61 are inputted with a second low frequency signal LC2, and a second terminal of the thirteenth thin-film transistor T61 is electrically connected to a first terminal of the fourteenth thin-film transistor T62 and a control terminal of the fifteenth thin-film transistor T63; a control terminal of the fourteenth thin-film transistor T62 is electrically connected to the pull-up control signal point Q for inputting the pull-up control signal Q(n), and a second terminal of the fourteenth thin-film transistor T62 is inputted with the DC low-voltage signal Vss; a first terminal of the fifteenth thin-film transistor T63 is inputted with the second low-frequency signal LC2, and a second terminal of the fifteenth thin-film transistor T63 is electrically connected to a first terminal of the sixteenth thin-film transistor T64, a control terminal of the seventeenth thin-film transistor T43, and a control terminal of the eighteenth thin-film transistor T33; a control terminal of the sixteenth thin-film transistor T64 is electrically connected to the pull-up control signal point Q for inputting the pull-up control signal Q(n), and a second terminal of the sixteenth thin-film transistor T64 is inputted with the DC low-voltage signal Vss; a first terminal of the seventeenth thin-film transistor T43 is inputted with the DC low voltage signal Vss, and a second end terminal of the seventeenth thin-film transistor T43 is electrically connected to the pull-up control signal point Q for maintaining the pull-up control signal Q(n) at an off state according to the second low frequency signal LC2 and the DC low voltage signal Vss; the first terminal of the eighteenth thin-film transistor T33 is inputted with the DC low voltage signal Vss, and the second terminal of the eighteenth thin-film transistor T33 is electrically connected to the horizontal scanning line G for maintaining the nth scan driving signal G(n) at an off state according to the second low frequency signal LC2 and the DC low voltage signal Vss.

7. The GOA circuit according to claim 6, wherein the pull-up control signal point Q is electrically connected to the horizontal scanning line G through a third capacitor Cb, and the third capacitor Cb is a bootstrap capacitor.

8. The GOA circuit according to claim 1, wherein a signal period of the first low frequency signal LC1 and the second low frequency signal LC2 is 200 times of a frame period, a duty ratio is 1/2, and a phase difference between the low frequency signal LC1 and the second low frequency signal LC2 is 1/2 signal period.

9. The GOA circuit according to claim 6, wherein the voltage level of operating point of the first pull-down maintaining circuit and the second pull-down maintaining circuit are a low voltage level of the pull-up control signal Q(n) and a high voltage level of the first low frequency signal LC1, and the low voltage level of the pull-up control signal Q(n) and a high voltage level of the second low frequency signal LC2.

10. A liquid crystal display device including a GOA circuit, and the GOA circuit comprises:
multiple cascaded GOA units, wherein a nth stage GOA unit charges a nth horizontal scanning line of a display region of a liquid crystal display panel, and the nth stage GOA unit includes at least a pull-up control circuit, a pull-up circuit, a voltage stabilization circuit, a pull-down circuit, a first pull-down maintaining circuit, and a second pull-down maintaining circuit, where n is a positive integer;
wherein the pull-up control circuit receives a start signal and outputs a pull-up control signal Q(n) according to the start signal;
wherein the pull-up circuit is electrically connected to the pull-up control circuit, and the pull-up circuit receives the pull-up control signal Q(n) and a first clock signal CK1, and outputs a nth stage transmission signal ST(n) and a nth stage scan driving signal G(n) according to the pull-up control signal Q(n) and the first clock signal;
wherein the voltage stabilization circuit is electrically connected to the pull-up control circuit and the pull-up circuit, and the voltage stabilization circuit receives the nth scan driving signal G(n) and a second clock CK2, and maintains the stability of a low voltage level of the pull-up control signal Q(n) according to the nth scan driving signal G(n) and the second clock signal CK2;
wherein the pull-down circuit is electrically connected to the pull-up control circuit, the pull-up circuit, and the voltage stabilization circuit, wherein the pull-down circuit receives a direct-current (DC) low-voltage signal Vss and according to the DC low-voltage signal Vss to pull down the pull-up control signal Q(n), and further pulls down the nth scan driving signal G(n) to cause the pull-up control signal Q(n) and the nth scan driving signal G(n) at an off state, and outputs an (n+1)th stage scan driving signal G(n+1) according to the DC low-voltage signal;
wherein the first pull-down maintaining circuit is electrically connected to the pull-up control circuit, the pull-up circuit, the voltage stabilization circuit, and the pull-down circuit, wherein the first pull-down maintaining circuit receives a first low-frequency signal LC1 and the DC low-voltage signal Vss, and maintains the pull-up control signal Q(n) and the nth stage scan driving signal G(n) at an off state according to the first low-frequency signal LC1 and the DC low-voltage signal; and
wherein the second pull-down maintaining circuit is electrically connected to the pull-up control circuit, the pull-up circuit, the voltage stabilization circuit, the pull-down circuit, and the first pull-down maintaining circuit, wherein the second pull-down maintaining circuit receives a second low-frequency signal LC2 and the DC low-voltage signal Vss, and maintains the pull-up control signal Q(n) and the nth stage scan driving signal G(n) at an off state according to the second low-frequency signal LC2 and the DC low-voltage signal Vss.

11. The liquid crystal display device according to claim 10, wherein when n=1, the start signal is an initial signal, and the pull-up control circuit outputs a pull-up control signal Q(n) according to the initial signal; when n>1, the start signal is a (n−1)th stage transmission signal ST(n−1) and a (n−1)th stage scan driving signal G(n−1) outputted by the (n−1)th stage GOA unit, the pull-up control circuit outputs a pull-up control signal Q(n) according to the (n−1)th stage transmission signal ST(n−1) and the (n−1)th stage scan driving signal G(n−1).

12. The liquid crystal display device according to claim 10, wherein he first pull-down maintaining circuit and the second pull-down maintaining circuit alternately operate to maintain the pull-up control signal Q(n) and the nth scan driving signal G(n) to be remained at the off state; the first clock signal CK1 and the second clock signal CK2 are mutually inverted signal.

13. The liquid crystal display device according to claim 11, wherein the pull-up control circuit includes: a first thin-film transistor, wherein when n=1, a control terminal and a first terminal of the first thin-film transistor T11 is inputted with an initial signal, and a second terminal of the first thin-film transistor T11 is connected to a pull-up control signal point Q for outputting a pull-up control signal Q(n) according to the initial signal;

when n>1, the control terminal of the first thin-film transistor T11 inputs a (n−1)th stage transmission signal ST(n−1), and the first terminal of the first thin-film transistor T11 inputs the (n−1)th stage scan driving signal G(n−1) and the second terminal of the first thin-film transistor T11 is connected to the pull-up control signal point Q for outputting the pull-up control signal Q(n) according to the (n−1)th stage transmission signal ST(n−1) and the (n−1)th stage scan driving signal G(n−1).

14. The liquid crystal display device according to claim 13, wherein the pull-up circuit includes a second thin-film transistor T22 and a third thin-film transistor T21, a control terminal of the second thin-film transistor T22 is electrically connected to the pull-up control signal point Q for receiving the pull-up control signal Q(n), and a first terminal of the second thin-film transistor T22 inputs a first clock signal CK1, a second terminal of the second thin-film transistor T22 outputs an nth stage transmission signal ST(n) according to the pull up control signal Q(n) and the first clock signal CK1; a control terminal of the third thin-film transistor T21 is electrically connected to the pull-up control signal point Q for receiving the pull-up control signal Q(n), a first terminal of the third thin-film transistor T21 inputs the first clock signal CK1, and a second terminal of the third thin-film transistor T21 is electrically connected to a horizontal scanning line G for outputting an nth stage scan driving signal G(n) according to the pull-up control signal Q(n) and the first clock signal;

the voltage stabilization circuit includes a first capacitor C1, a second capacitor C2; one end of the first capacitor is electrically connected to the pull-up control signal point Q for receiving the pull-up control signal Q(n), and the other end of the first capacitor inputs a second clock signal CK2; one end of the second capacitor is electrically connected to the pull-up control signal point Q for receiving the pull-up control signal Q(n), and the other end of the second capacitor is electrically connected to the horizontal scanning line G; and the pull-down circuit includes a fifth thin-film transistor T41 and a sixth thin-film transistor T31; a first terminal of the fifth thin-film transistor T41 is inputted with the DC low-voltage signal Vss, and a second terminal of the fifth thin-film transistor T41 is electrically connected to the pull-up control signal point Q for pulling down the pull-up control signal Q(n) according to the DC low-voltage signal Vss such that the pull-up control signal Q(n) is at an off state, and a control terminal of the fifth thin-film transistor T41 is electrically connected to a control terminal of the sixth thin-film transistor T31 for outputting a (n+1)th scan driving signal G(n+1) according to the DC low voltage signal Vss; a first terminal of the sixth thin-film transistor T31 inputs the DC low voltage signal Vss, and a second terminal of the sixth thin-film transistor T31 is electrically connected to the horizontal scanning line G to pull down the nth stage scan driving signal G(n) according to the DC low voltage signal Vss, so that the nth stage scan driving signal G(n) is at an off state.

15. The liquid crystal display device according to claim 14, wherein the first pull-down maintaining circuit includes a seventh thin-film transistor T51, an eighth thin-film transistor T52, a ninth thin-film transistor T53, a tenth thin-film transistor T54, an eleventh thin-film transistor T42, and a twelve thin-film transistor T32; a control terminal and a first terminal of the seventh thin-film transistor T51 are inputted with a first low frequency signal LC1, and a second terminal of the seventh thin-film transistor T51 is electrically connected to a first terminal of the eighth thin-film transistor T52 and a control terminal of the ninth thin-film transistor T53; a control terminal of the eighth thin-film transistor T52 is electrically connected to the pull-up control signal point Q for inputting the pull-up control signal Q(n), and the second terminal of the eighth thin-film transistor T52 is inputted with the DC low voltage signal Vss;

a first terminal of the ninth thin-film transistor T53 is inputted with the first low frequency signal LC1, and a second terminal of the ninth thin-film transistor T53 is electrically connected to a first terminal of the tenth thin-film transistor T54, a control terminal of an eleventh thin-film transistor T42 and a control terminal of the twelfth thin-film transistor T32 through the first signal point S; a control terminal of the tenth thin-film transistor T54 is electrically connected to the pull-up control signal point Q for inputting the pull-up control signal Q(n), and a second terminal of the tenth thin-film transistor T54 is inputted with the DC low-voltage signal Vss; a first terminal of the eleventh thin-film transistor T42 is inputted with the DC low voltage signal Vss, and the second terminal of the eleventh thin-film transistor T42 is electrically connected to the pull-up control signal point Q for maintaining the pull-up control signal Q(n) at an off state according to the first low frequency signal LC1 and the DC low voltage signal Vss; a first terminal of the twelfth thin-film transistor T32 is inputted with the DC low voltage signal Vss, and a second terminal of the twelfth thin-film transistor T32 is electrically connected to the horizontal scanning line G for maintaining the nth-stage scan driving signal G(n) at an off state according to the first low frequency signal LC1 and the DC low voltage signal Vss;

the second pull-down maintaining circuit includes: a thirteenth thin-film transistor T61, a fourteenth thin-film transistor T62, a fifteenth thin-film transistor T63, a sixteenth thin-film transistor T64, and a seventeenth thin-film transistor T43, and an eighteenth thin-film transistor T33; a control terminal and a first terminal of the thirteenth thin-film transistor T61 are inputted with a second low frequency signal LC2, and a second terminal of the thirteenth thin-film transistor T61 is electrically connected to a first terminal of the fourteenth thin-film transistor T62 and a control terminal of the fifteenth thin-film transistor T63; a control terminal of the fourteenth thin-film transistor T62 is electrically connected to the pull-up control signal point Q for inputting the pull-up control signal Q(n), and a second terminal of the fourteenth thin-film transistor T62 is inputted with the DC low-voltage signal Vss; a first terminal of the fifteenth thin-film transistor T63 is inputted with the second low-frequency signal LC2, and a second terminal of the fifteenth thin-film transistor T63 is electrically connected to a first terminal of the sixteenth thin-film transistor T64, a control terminal of the seventeenth thin-film transistor T43, and a control terminal of the eighteenth thin-film transistor T33; and a control terminal of the sixteenth thin-film transistor T64 is electrically connected to the pull-up control signal point Q for inputting the pull-up control signal Q(n), and a second terminal of the sixteenth thin-film transistor T64 is inputted with the DC low-voltage signal Vss; a first terminal of the seventeenth thin-film transistor T43 is inputted with the DC low voltage signal Vss, and a second end terminal of the seventeenth thin-film transistor T43 is electrically connected to the pull-up control signal point Q for maintaining the pull-up control signal Q(n) at an off state according to the second low frequency signal LC2 and the DC low voltage signal Vss; the first terminal of the eighteenth thin-film transistor T33 is inputted with the DC low voltage signal Vss, and the second terminal of the eighteenth thin-film transistor T33 is electrically connected to the horizontal scanning line G for maintaining the nth scan driving signal G(n) at an off state according to the second low frequency signal LC2 and the DC low voltage signal Vss.

16. The liquid crystal display device according to claim 15, wherein the pull-up control signal point Q is electrically connected to the horizontal scanning line G through a third capacitor Cb, and the third capacitor Cb is a bootstrap capacitor.

17. The liquid crystal display device according to claim 10, wherein a signal period of the first low frequency signal LC1 and the second low frequency signal LC2 is 200 times of a frame period, a duty ratio is 1/2, and a phase difference between the low frequency signal LC1 and the second low frequency signal LC2 is 1/2 signal period.

18. The liquid crystal display device according to claim 15, wherein the voltage level of operating point of the first pull-down maintaining circuit and the second pull-down maintaining circuit are a low voltage level of the pull-up control signal Q(n) and a high voltage level of the first low frequency signal LC1, and the low voltage level of the pull-up control signal Q(n) and a high voltage level of the second low frequency signal LC2.

* * * * *